United States Patent
Falk et al.

(10) Patent No.: US 10,298,017 B2
(45) Date of Patent: May 21, 2019

(54) CIRCUIT ARRANGEMENT FOR A PHOTOVOLTAIC INVERTER FOR BREAK RELIEF USING SHORT-CIRCUIT SWITCHES, AND USES OF THE CIRCUIT ARRANGEMENT

(71) Applicant: SMA Solar Technology AG, Niestetal (DE)

(72) Inventors: Andreas Falk, Kassel (DE); Franz Lukas, Rosenheim (DE)

(73) Assignee: SMA Solar Technology AG, Niestetal (DE)

( * ) Notice: Subject to any disclaimer, the term of this patent is extended or adjusted under 35 U.S.C. 154(b) by 387 days.

(21) Appl. No.: 15/072,761

(22) Filed: Mar. 17, 2016

(65) Prior Publication Data

US 2016/0226256 A1 Aug. 4, 2016

Related U.S. Application Data (63) Continuation of application No. PCT/EP2014/069641, filed on Sep. 15, 2014.

(30) Foreign Application Priority Data

Sep. 17, 2013 (DE) .................. 10 2013 110 240

(51) Int. Cl.
*H02J 1/00* (2006.01)
*H02J 3/00* (2006.01)
(Continued)

(52) U.S. Cl.
CPC ........ *H02J 3/383* (2013.01); *H01L 31/02021* (2013.01); *H02H 3/023* (2013.01);
(Continued)

(58) Field of Classification Search
CPC . H02J 3/383; H02M 7/44; H02M 1/32; H02S 40/32; H02H 7/02; H02H 3/023; Y02E 10/563
See application file for complete search history.

(56) References Cited

U.S. PATENT DOCUMENTS

| 2009/0167097 A1* | 7/2009 | Seymour | ................. H02J 3/383 307/113 |
| 2010/0020576 A1* | 1/2010 | Falk | ........................ H02M 7/44 363/55 |

(Continued)

FOREIGN PATENT DOCUMENTS

| DE | 1109773 | 6/1961 |
| DE | 102005061532 A1 | 7/2007 |

(Continued)

OTHER PUBLICATIONS

International Search Report dated Jul. 16, 2015 PCT/EP2014/069641.

*Primary Examiner* — Hal Kaplan
*Assistant Examiner* — Rasem Mourad
(74) *Attorney, Agent, or Firm* — Eschweiler & Potashnik, LLC (57) ABSTRACT

A circuit arrangement for a photovoltaic inverter includes two bus lines, input terminals for connecting at least one photovoltaic generator to the bus lines, respectively, and at least one DC/AC converter connected to the bus lines. The circuit arrangement further includes a disconnector between each DC/AC converter and the bus lines, respectively, and at least one short-circuit path for short-circuiting a voltage between the bus lines, wherein a short-circuit switch is arranged in the short-circuit path, wherein the at least one short-circuit path runs between the bus lines upstream of all disconnectors between the input terminals and the disconnectors, and wherein the short-circuit switch in the at least (Continued)

one short-circuit path between the bus lines is connected in series with a fuse. Still further, the circuit arrangement includes at least one further short-circuit path for short-circuiting the voltage between the bus lines, wherein a short-circuit switch likewise is arranged in the at least one further short-circuit path.

23 Claims, 4 Drawing Sheets

(51) Int. Cl.
    *H02J 3/38*     (2006.01)
    *H01L 31/02*     (2006.01)
    *H02H 3/02*     (2006.01)
    *H02H 7/20*     (2006.01)
    *H02S 40/32*     (2014.01)
    *H02M 1/32*     (2007.01)
    *H02M 7/44*     (2006.01)

(52) U.S. Cl.
    CPC ............... *H02H 7/20* (2013.01); *H02M 1/32* (2013.01); *H02M 7/44* (2013.01); *H02S 40/32* (2014.12); *Y02E 10/563* (2013.01)

(56) References Cited

U.S. PATENT DOCUMENTS

| | | | |
|---|---|---|---|
| 2012/0007657 A1 | 1/2012 | Naumann et al. | |
| 2013/0057989 A1 | 3/2013 | Victor et al. | |
| 2013/0170084 A1 | 7/2013 | Strobl et al. | |
| 2013/0335861 A1* | 12/2013 | Laschinski | H02H 1/0015 361/2 |
| 2014/0313624 A1* | 10/2014 | Chen | H02H 3/16 361/45 |
| 2015/0008672 A1* | 1/2015 | Garcia | H02J 3/24 290/44 |
| 2015/0155809 A1* | 6/2015 | Gupta | F03D 7/0224 290/44 |
| 2015/0381108 A1* | 12/2015 | Hoft | H02S 50/10 136/244 |

FOREIGN PATENT DOCUMENTS

| | | |
|---|---|---|
| DE | 102007054647 A1 | 6/2009 |
| DE | 102011017362 A1 | 10/2012 |
| DE | 102012106505 A1 | 1/2014 |
| EP | 2337184 A2 | 6/2011 |
| EP | 2390981 A1 | 11/2011 |
| JP | 2003061364 A | 2/2003 |
| WO | 2013091689 A1 | 6/2013 |

* cited by examiner

CIRCUIT ARRANGEMENT FOR A PHOTOVOLTAIC INVERTER FOR BREAK RELIEF USING SHORT-CIRCUIT SWITCHES, AND USES OF THE CIRCUIT ARRANGEMENT

CROSS REFERENCE TO RELATED APPLICATIONS

This application claims priority to International Patent Application number PCT/EP2014/069641, filed on Sep. 15, 2014, which claims priority to German Patent Application number 10 2013 110 240.9, filed on Sep. 17, 2013, and is hereby incorporated in its entirety.

FIELD

The disclosure relates to a circuit arrangement for a photovoltaic inverter and to the use of such a circuit arrangement.

BACKGROUND

If a plurality of DC/AC converters are connected on their input side via a respective disconnector to common bus lines, then in the case of a serious fault in one of the DC/AC converters that results in a short circuit between its connection lines, the short-circuit current generated by all photovoltaic generators connected to the bus lines flows via the disconnector provided between the bus conductor and the faulty DC/AC converter. In order to be able to safely interrupt the short-circuit current with the disconnector, the limiting turn-off capacity of the disconnector has to be designed for the short-circuit current, even though the latter is a multiple of the DC current that flows via the disconnector in undisturbed operation and has to be turned off by means of the disconnector.

Fuses, via which the photovoltaic generators might be connected to the bus lines, usually do not respond to the short-circuit current flowing in the described case because the short-circuit current is only slightly greater than the nominal current of the respective photovoltaic generator.

DE 10 2010 017 746 A1 discloses a photovoltaic installation comprising a photovoltaic generator connected to a photovoltaic inverter. The photovoltaic inverter comprises a DC disconnecting device that is controllable by means of a control device. Furthermore, the photovoltaic inverter comprises a short-circuiting device, by means of which the photovoltaic generator can be short-circuited upstream of the DC disconnecting device and which is likewise controllable by means of the control device. The DC disconnecting device can comprise a relay that causes all-pole disconnection of the photovoltaic generator from a DC/AC converter of the photovoltaic inverter. The short-circuiting device can comprise a semiconductor switch.

DE 10 2009 019 831 A1 discloses a circuit arrangement for electrically coupling a DC source, e.g. a photovoltaic generator, to a DC load, e.g. an inverter. The circuit arrangement comprises a first and second current input node for receiving a DC current generated by the DC source, and a first and second current output node for outputting the generated DC current to the DC load. The circuit arrangement also includes a disconnecting means connected between the first current input node and the first current output node and/or the second current input node and the second current output node and serving for interrupting the electrical connection between the respective nodes, and an auxiliary switching means connected between the first current input node and the second current input node and serving for short-circuiting the first and second current input nodes. If the auxiliary switching means for short-circuiting is closed, the DC source is thus short-circuited. What can be achieved thereby is that the current to the load is reduced to zero. Although the DC source continues to generate DC current, the latter no longer flows, or flows at most in very small amounts, to the load due to the short circuit. The disconnecting means can then open in order to interrupt the electrical connection between the respective nodes. Consequently, the known problem of interrupting even a particularly large DC current does not occur for the disconnecting means. Rather, it can switch in the currentless state. Accordingly, it is possible to use a cheap disconnecting means, which does not need to be suitable for switching under load. DE 10 2009 019 831 A1 is not concerned with the question of safely turning off the short-circuit current by the auxiliary switching means.

WO 2011/023732 A2 discloses a bypass and protection circuit for a solar module and a method for controlling the solar module. The bypass and protection circuit comprises an input for connecting the solar module, an output, a bypass element connected in parallel with the output, a disconnecting element connected between the input and the output, and a protection element in the form of a diode connected in parallel with the input. In this case, the disconnecting element is configured to control a connection between the input and the output depending on whether the solar module assigned to the bypass and protection circuit is wholly or partly shaded or is intended to be switched on or off. The disconnecting element comprises a switch, and the bypass element comprises a diode with a switch connected in parallel. The bypass element is arranged downstream of the disconnecting element, as viewed from the solar module. Relays can be used as the switch. Semiconductor components are preferred. In the case of the connected solar module being shaded, the switch of the disconnecting element is opened and the switch of the bypass element is closed.

WO 2004/082091 A1 discloses an electronic disconnector for connecting a power supply network to an output for connecting a load. Between the input and the output, the disconnector comprises a series connection of a fuse, a semiconductor switch and a relay. The controller controls the semiconductor switch in such a way that substantially voltageless switching of the relay occurs.

DE 10 2010 007 452 A1 discloses a load relief for a disconnector for use in the field of electric vehicles, wherein the disconnector has to perform a galvanic isolation between a battery and an intermediate circuit. The load relief comprises at least one semiconductor switch. For disconnecting the electrical connection, the current to be turned off is conducted via the semiconductor switch. The disconnector is then turned off under reduced voltage increase.

EP 2 148 417 A1 discloses an inverter circuit arrangement for a photovoltaic generator comprising a plurality of DC/AC converters connected in series at the input. A photovoltaic generator is connected to this input-side series connection of the DC/AC converters. A bridging switch is provided for each of the DC/AC converters. The bridging switch is located in a DC voltage intermediate circuit and bridges the respective DC/AC converter in the closed state. A resistance chopper is connected in parallel with each bridging switch. Each resistance chopper consists of a controllable semiconductor switch, a resistor connected in series therewith, and a diode connected in parallel with the resistor, wherein the forward direction of the diode is in the opposite direction to that semiconductor switch, such that it fulfills the function of a freewheeling diode. With bridging switches open, the resistance choppers are clocked in order to discharge capacitors of input-side DC voltage intermediate circuits of the DC/AC converters.

SUMMARY

The problem addressed by the disclosure is that of providing a circuit arrangement for a photovoltaic inverter in which the disconnectors between each DC/AC converter and the bus lines can have a significantly lower limiting break capacity than the maximum short-circuit current of all connected photovoltaic generators and in which the maximum short-circuit current, if it flows via a single one of the DC/AC converters, can nevertheless be turned off safely. Furthermore, the intention is to demonstrate advantageous uses of the circuit arrangement.

The disclosure is based on a circuit arrangement for a photovoltaic inverter that comprises two bus lines, input terminals for at least one photovoltaic generator to the bus lines, at least one DC/AC converter connected to the bus lines, a respective disconnector between each DC/AC converter and the bus lines, and at least one short-circuit path for short-circuiting a voltage between the bus lines, having a short-circuit switch. The present disclosure has particular advantages if a plurality of DC/AC converters are connected to the bus lines in parallel with one another.

According to the disclosure, the at least one short-circuit path runs between the bus lines upstream of all the disconnectors. At least one further short-circuit path for short-circuiting the voltage between the bus lines is present. In the at least one short-circuit path, the short-circuit switch is connected in series with a fuse.

At least one of the short-circuit switches can be a thyristor that is triggerable for closing. A thyristor can safely switch a large short-circuit current. For this purpose, it is triggered, i.e. switched to the conducting state, with just a small gate current and remains in the conducting state until a holding current flowing through it is undershot. In one embodiment, the short-circuit switches present in all the short-circuit paths are thyristors.

In one embodiment, the short-circuit switch in the at least one short-circuit path between the bus lines upstream of all the disconnectors is furthermore connected in series with a current-limiting component. A current-limiting component should be understood here to mean a component that, upon the closing of the short-circuit switch, limits the current while the short-circuit switch becomes conducting. In particular, the current-limiting component is an inductor, for example a damping inductor, which has only an insignificant ohmic resistance. In principle, however, the current-limiting component can also be an ohmic resistor. The current-limiting component can be omitted if the fuse and the short-circuit switch in the at least one short-circuit path allow for a high switch-on current.

The fuse connected in series with the short-circuit switch in the at least one short-circuit path between the bus lines upstream of all the disconnectors is not regarded here as a current-limiting component. Rather, fuse here denotes a component that protects against an overcurrent by turning it off. In particular, in one embodiment the fuse is a lead fuse suitable for automatically turning off the short-circuit current of all connected photovoltaic generators. A triggerable fuse can also be involved, for example one that is equipped with an explosive charge that interrupts the current after ignition.

If, in the circuit arrangement according to the disclosure, a current through one of the disconnectors occurs that goes beyond the limiting relief capacity of the disconnector, the short-circuit switches in the short-circuit paths can be closed, such that they become conducting and short-circuit the voltage between the bus lines. In this case, the short-circuit switch in the at least one short-circuit path, which runs between the bus lines upstream of all the disconnectors and in which the fuse is connected in series with the short-circuit switch, can be closed last in order, such that the fuse is not immediately subjected to the full short-circuit current. Rather, in one embodiment only a part of the short-circuit current initially flows via the at least one short-circuit path of the circuit arrangement according to the disclosure, which runs between the bus lines upstream of the disconnectors. As soon as all the short-circuit switches are closed and the voltage between the bus lines has consequently decreased to zero, the disconnectors can be opened safely because even across the switching contacts of the disconnector via which the short-circuit current flowed initially, there is no longer a voltage drop upon opening. After that, the short-circuit current is concentrated on the at least one short-circuit path, which runs between the bus lines upstream of the disconnectors. This has the effect that the fuse arranged in the short-circuit path trips and turns off the short-circuit current in order that the short-circuit current does not flow for an unnecessarily long time. Already due to the short-circuit current also flowing via other paths beforehand, premature tripping of the fuse does not occur. In addition, upon tripping, a lead fuse has a typical time delay, which can be used here for opening the disconnectors before the current through the at least one of the short-circuit paths, which has the fuse and runs between the bus lines upstream of the disconnectors, is turned off.

In principle, the at least one further short-circuit path of the circuit arrangement according to the disclosure can likewise run between the bus lines upstream of the disconnectors. It is advantageous in one embodiment, however, for the at least one further short-circuit path, and also all other further short-circuit paths, in each case to run downstream of one of the disconnectors and between the connection lines of the associated DC/AC converter. As a result, these further short-circuit paths are deactivated by the opening of the disconnectors in face of closed short-circuit switches, and, with opened disconnectors, the entire short-circuit current flows via the at least one short-circuit path upstream of the disconnectors in which the fuse is provided, such that the fuse trips after the opening of the disconnectors.

In one embodiment, downstream of at least two of the disconnectors a further short-circuit path runs respectively between the connection lines of the associated DC/AC converter. Downstream of each of the disconnectors, a further short-circuit path can run respectively between the connection lines of the associated DC/AC converter. In one embodiment, however, the total number of short-circuit paths and accordingly the total number of short-circuit switches in the circuit arrangement according to the disclosure are kept at a value less than or equal to the total number of DC/AC converters connected in parallel.

In each of the further short-circuit paths, in one embodiment a current-limiting component is connected in series with the respective short-circuit switch. In this case, it is advantageous if the current-limiting component in at least one of the further short-circuit paths is a discharge resistor.

Upon the closing of the associated short-circuit switch, all input-side intermediate circuit capacitors of all DC/AC converters are discharged via the discharge resistor, depending on the size thereof at least substantially. As a result, the short-circuit switches of the circuit arrangement according to the disclosure can basically be designed to be smaller, because the electrical energy stored in the intermediate circuit capacitors is converted into heat in the discharge resistor, rather than in the short-circuit switches.

It is particularly desired in one embodiment if the current-limiting component in at least one of the further short-circuit paths is an inductor. Although on the one hand it limits the maximum current to which the short-circuit switch connected in series therewith is subjected, on the other hand, unlike a discharge resistor, it enables the reduction of the voltage between the bus lines, the voltage being short-circuited via the short-circuit path, down to zero or close to zero because its ohmic resistance can be disregarded.

In the circuit arrangement according to the disclosure, in parallel with the at least one of the short-circuit paths upstream of the disconnectors at least a further one of the short-circuit paths can run directly between the bus lines, wherein the short-circuit switch in the at least one further one of the short-circuit paths is also connected in series with a current-limiting component and a fuse. If the short-circuit switches connected in series with the fuses are then embodied as turn-off thyristors, for example in the form of so-called gate turn-off thyristors (GTOs), they can be switched off again after the opening of the disconnectors even before the fuses connected in series with them will trip. A plurality of parallel-connected short-circuit paths with turn-off thyristors are expedient here because GTOs of arbitrarily large size are not available and, moreover, the dimensioning of the fuses is simpler in this case.

In a further concrete embodiment of the circuit arrangement according to the disclosure, a plurality of short-circuit paths run between the bus lines upstream of the disconnectors, in each of which a short-circuit switch is connected in series with a current-limiting component and a triggerable fuse. For short-circuiting the voltage between the bus lines, one of the short-circuit switches is respectively closed. The fuse connected in series with the short-circuit switch is triggered as soon as the disconnectors are open and capable of blocking. The disconnectors are capable of blocking when the air or the protective gas between the contacts of the disconnector is sufficiently deionized. For this purpose, the fuse has to trigger with a sufficient delay. After the triggering of the fuse, although the respective short-circuit path is used up, at least one further short-circuit path is available for a repetition of the described sequence of steps before maintenance of the circuit arrangement by replacement or at least resetting of the triggered fuses has to be carried out.

In one embodiment, the disconnectors in the circuit arrangement according to the disclosure effect all-pole disconnection of the DC/AC converters from the bus lines. However, a single-pole disconnection can also be done. Moreover, the DC/AC converters are, in one embodiment, connectable on their output side via a common AC contactor or individual AC contactors to a grid connection. All the AC contactors are preferably opened before the short-circuit switches of the circuit arrangement according to the disclosure are closed.

One feature of the use according to the disclosure of the circuit arrangement according to the disclosure is that the disconnectors are opened in the case of conducting short-circuit switches. However, not every opening of the disconnectors demands a prior closing of the short-circuit switches. Rather, this closing of the short-circuit switches for the opening of the disconnectors can be restricted to such cases in which a DC current that exceeds a limiting break current of at least one of the disconnectors flows from the bus lines to at least one of the connected DC/AC converters. The current flowing from the bus lines to the connected DC/AC converter is regularly monitored anyway for photovoltaic inverters.

Upon the closing of the short-circuit switches, in one embodiment it is advantageous if the short-circuit switch in the at least one short-circuit path, which runs between the bus lines upstream of all the disconnectors and in which the fuse is connected in series with the short-circuit switch, and each further short-circuit path that is directly connected in parallel with it, and which likewise has a fuse connected in series with its short-circuit switch, is closed last, i.e. only after all short-circuit switches in all other short-circuit paths, which run downstream of the disconnectors of the DC/AC converters, have been closed. Furthermore, in one embodiment each short-circuit switch connected in series with a discharge resistor in a short-circuit path is closed first, i.e. before all other short-circuit switches are closed.

Advantageous developments of the disclosure emerge from the patent claims, the description and the drawings. The advantages of features and of combinations of a plurality of features as mentioned in the description are merely by way of example and can come into effect alternatively or cumulatively, without the advantages necessarily having to be achieved by embodiments according to the disclosure. Without the subject of the accompanying patent claims being altered thereby, the following applies to the disclosure content of the original application documents and of the patent: further features can be gathered from the drawings—in particular from the illustrated relative arrangement and the operative connections of a plurality of components. The combination of features of different embodiments of the disclosure or of features of different patent claims is likewise possible departing from the chosen dependency references of the patent claims and is suggested hereby. This also concerns such features that are illustrated in separate drawings or are mentioned in the description thereof. These features can also be combined with features of different patent claims. It is likewise possible to omit features presented in the patent claims for further embodiments of the disclosure.

The features mentioned in the patent claims and in the description should be understood, with regard to their number, such that exactly this number or a greater number than the number mentioned is present, without the need for explicit use of the adverb "at least". Therefore, if an element is mentioned, for example, this should be understood to mean that exactly one element, two elements or more elements are present. Insofar as the adverb "at least" is nevertheless used here, it indicates that the presence of a plurality of elements is not unlikely. These elements can be supplemented by other features or be the sole features that the respective product comprises.

The reference numerals contained in the patent claims do not restrict the scope of the subject matter protected by the patent claims. They merely serve the purpose of making the patent claims more easily comprehensible.

BRIEF DESCRIPTION OF THE DRAWINGS

The disclosure is explained and described further below on the basis of preferred exemplary embodiments illustrated in the figures.

DETAILED DESCRIPTION

Figure 1:
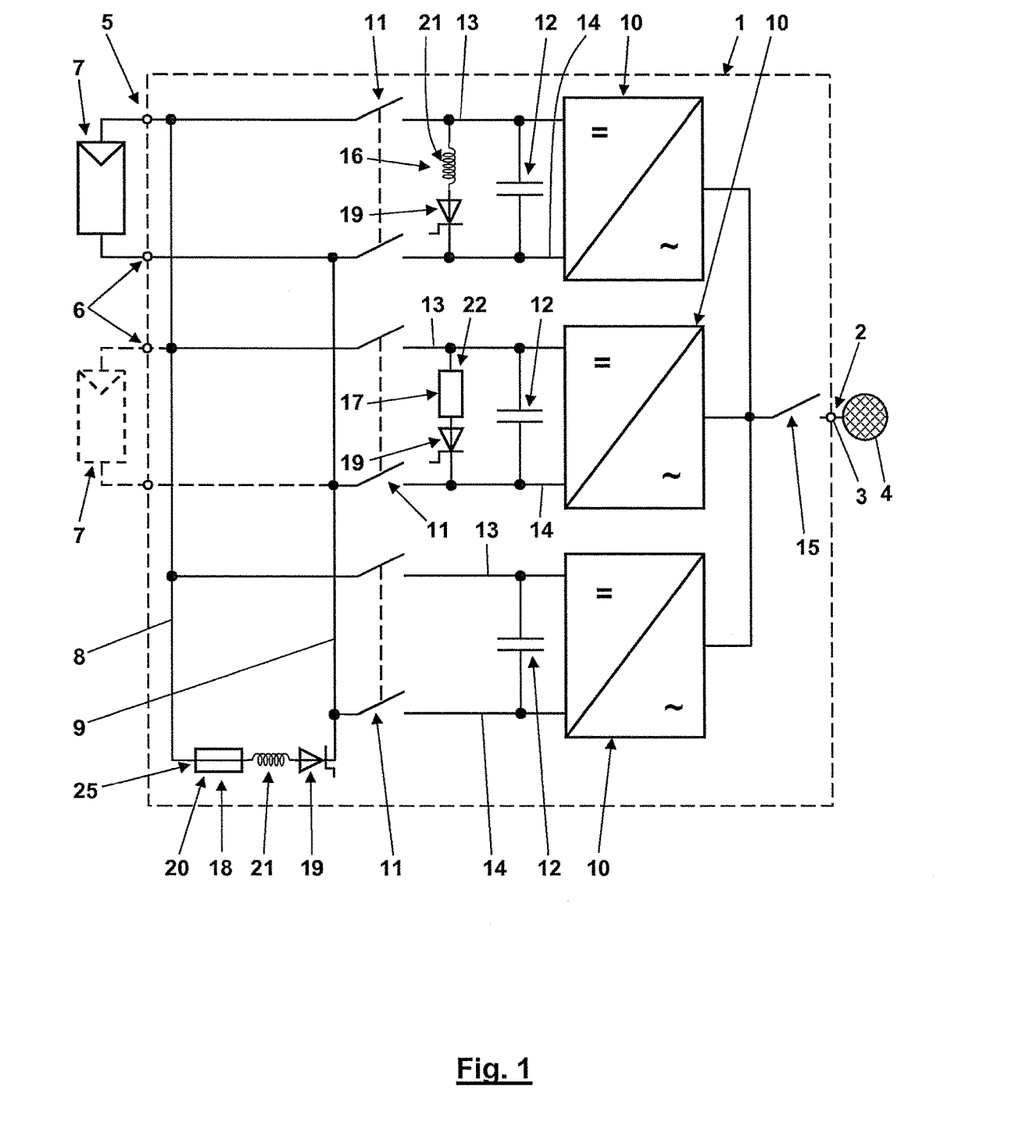
FIG. 1 schematically shows a first embodiment of a circuit arrangement according to the disclosure for a photovoltaic inverter comprising three differently configured short-circuit paths each comprising a short-circuit switch.

FIG. 1 schematically illustrates the parts of a circuit arrangement for a photovoltaic inverter 1 that are essential to the present disclosure. The photovoltaic inverter 1 does also comprise additional component parts, which are not illustrated in specific detail here but will be supplemented by the person skilled in the art in line with this person's technical knowledge. They include, for example, sine filters at the output 2 of the photovoltaic inverter 1, at which the photovoltaic inverter 1 is connectable via an output terminal 3 to an AC grid 4.

At its input 5, the photovoltaic inverter 1 comprises input terminals 6 for connecting photovoltaic generators 7. In one embodiment of the inverter 1, input terminals 6 for a single photovoltaic generator 7 are provided. Further input terminals 6 for a further photovoltaic generator 7 are even also indicated here by dashed lines. The number of connected photovoltaic generators 7 can also be even greater than 2. Parallel to one another, the input terminals 6 lead to two bus lines 8 and 9 in the photovoltaic inverter 1. A plurality of DC/AC converters 10 are connected to the bus lines 8 and 9 in parallel with one another in each case via a pair of connection lines 13 and 14. Three DC/AC converters 10 are illustrated in FIG. 1 and the following figures. However, the number of DC/AC converters 10 can also be just one or two or greater than three. A disconnector 11 that causes all-pole disconnection is provided for each of the DC/AC converters 10, by means of which the respective DC/AC converter is disconnectable from the bus lines 8 and 9. Furthermore, an input-side intermediate circuit capacitor 12 is provided for each DC/AC converter 10, wherein the intermediate circuit capacitor is connected, as viewed from the bus lines 8 and 9, downstream of the respective disconnector 11 between the connection lines 13 and 14 of the DC/AC converter.

If a serious fault occurs in one of the DC/AC converters 10, the fault short-circuiting the connection lines 13 and 14 of the DC/AC converter, the photovoltaic inverter 1 is at first disconnected from the AC grid 4 by the opening of an output-side AC contactor 15 and the DC/AC converters 10 are turned off. On account of the serious fault, at the latest then the entire short-circuit current from all photovoltaic generators 7 that are connected via the input terminals 6 to the bus lines 8 and 9 flows via the associated disconnector 11 to the faulty DC/AC converter and back. In principle, therefore, the limiting break capacity of the disconnectors 11 would have to be designed not only for the currents occurring during normal operation, but also to be able to turn off this significantly higher short-circuit current. In the case of the photovoltaic inverter 1 in accordance with FIG. 1, short-circuit paths 16 to 18 with short-circuit switches 19 in the form of triggerable thyristors arranged therein are provided instead, with the aid of which, even in the case of a significantly lower limiting break capacity of the disconnectors 11, which is of the order of magnitude of the nominal current, for example, it is possible to turn off the short-circuit current safely in the described fault situation.

One of the short-circuit paths 16 to 18, specifically the short-circuit path 18, is connected directly between the bus lines 8 and 9, and in the short-circuit path a fuse 20 in the form of a lead fuse 25 and an inductor 21 are connected in series with the short-circuit switch 19. The other two short-circuit paths 16 and 17 here run in each case, as viewed from the bus lines 8 and 9, downstream of a disconnector 11 between the connection lines 13 and 14 of the associated DC/AC converter 10. In this case, in the short-circuit path 16 an inductor 21 is connected in series with the short-circuit switch 19, while in the short-circuit path 17 a discharge resistor 22 is connected in series with the short-circuit switch 19 therein.

In order to stop the short-circuit current in the case of a serious fault in one of the DC/AC converters after the opening of the AC contactor 15 and the turning-off of the DC/AC converters 10, at first the short-circuit switch 19 in the short-circuit path 17 is closed. Consequently, the intermediate circuit capacitors 12 of all the DC/AC converters 10 are discharged via the discharge resistor 22. In this case, the energy stored in the intermediate circuit capacitors 12 is converted into heat in the discharge resistor 22. After that, at first additionally the short-circuit switch 19 in the short-circuit path 16 is closed and then the short-circuit switch 19 in the short-circuit path 18 is also closed. As a result, the voltage between the bus lines 8 and 9 is reduced further than is possible via the discharge resistor 22 of the short-circuit path 17. In the case of this procedure, the fuse 20 so far has not yet been subjected to the full short-circuit current of the photovoltaic generators 7 connected to the bus lines 8 and 9, since this short-circuit current is still divided up across all the short-circuit paths 16 to 18, but in particular across the short-circuit paths 16 and 18, i.e. the short-circuit paths without a discharge resistor 22. Upon the closing of the individual short-circuit switches 19, either the discharge resistor 22 or the inductor 21 prevents an initially excessively increased current flowing through the respective short-circuit path 16, 17 or 18.

As soon as the voltage between the bus lines 8 and 9 is reduced toward zero with the aid of the short-circuit paths 16 to 18, the disconnectors 11 can be opened safely even if their limiting break capacity corresponds only to the nominal current of the respective DC/AC converter 10 or is even lower. Specifically, the disconnectors 11 need not be load disconnectors.

As soon as all disconnectors 11 downstream of which a short-circuit path 16 or 17 is arranged or that lead to the faulty DC/AC converter 10 are open in this case, the entire short-circuit current of the photovoltaic generators 7 connected to the bus lines 8 and 9 flows via the short-circuit path 18 and thus through the lead fuse 25. The lead fuse 25 is dimensioned such that it trips in the case of this full short-circuit current and thus interrupts the short-circuit path 18. The short-circuit current is thus finally stopped. The lead fuse 25 is designed with regard to its response behavior to the full short-circuit current such that it trips only with a time delay such that all disconnectors 11 are deionized in the region of their disconnection sections to such an extent that they do not become conductive again between their switching contacts as a result of the presence of the open circuit voltage of the photovoltaic generators 7.

Figure 2:
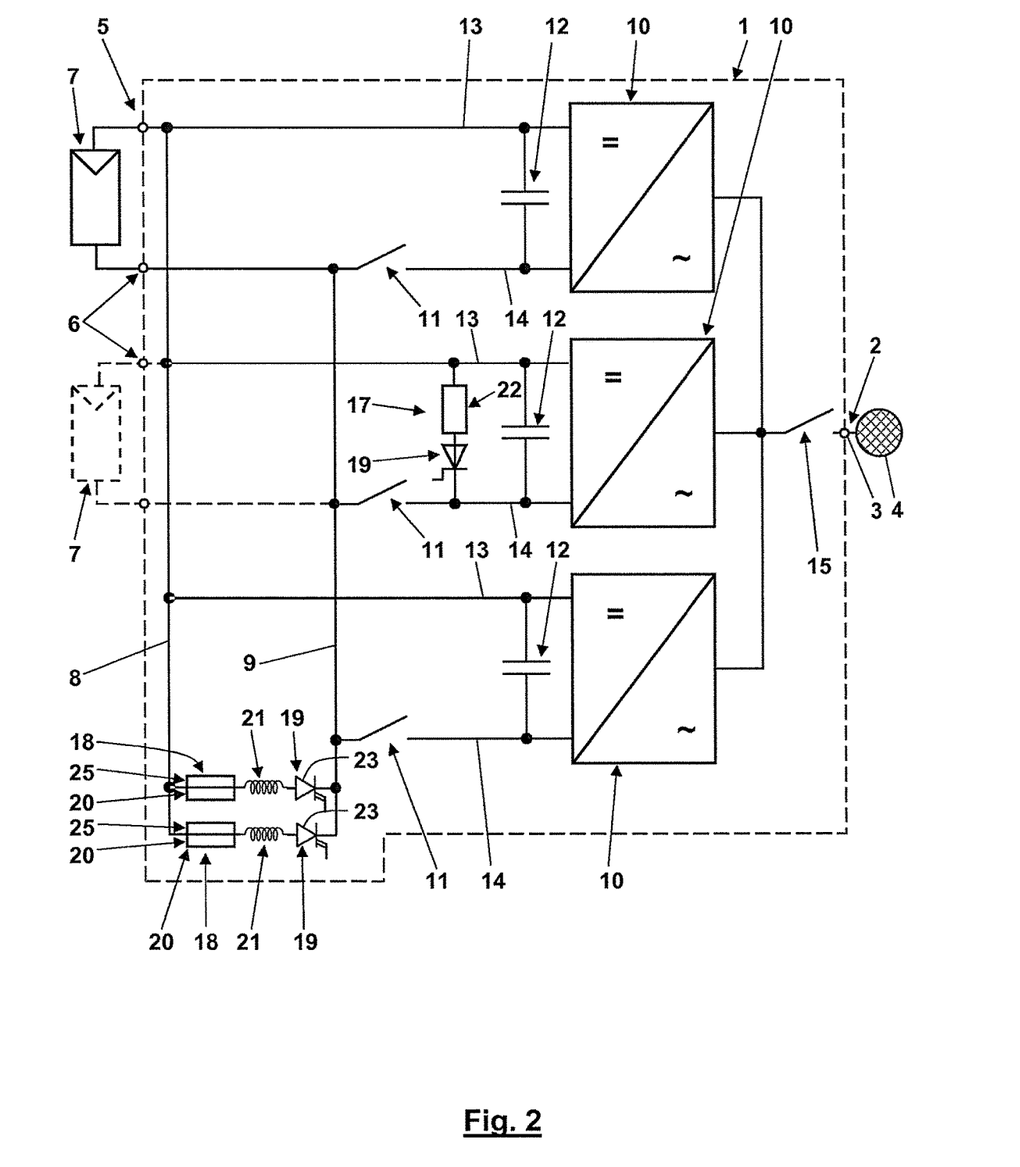
FIG. 2 shows a second embodiment of a circuit arrangement according to the disclosure, likewise comprising three short-circuit paths each comprising a short-circuit switch, wherein here two of the short-circuit paths having an identical structure are connected in parallel directly between bus lines.

The circuit arrangement according to the disclosure of the photovoltaic inverter 1 in accordance with FIG. 2 differs from that in accordance with FIG. 1 with regard to the short-circuit paths 17 and 18. In this regard, the short-circuit path 16 in accordance with FIG. 1 is omitted here. On the other hand, an identically designed further short-circuit path 18 is connected in parallel with the short-circuit path 18 directly between the bus lines 8 and 9. The short-circuit switches 19 of these two short-circuit paths 18 are embodied as turn-off thyristors in the form of so-called GTOs 23. It is thus possible to stop the short-circuit current after the opening of the disconnectors 11 even without the fuses 20 tripping, by virtue of the GTOs 23 being switched off. In this case, the short-circuit paths 18 connected in parallel are expedient since GTOs 23 of arbitrarily large size are not available and since dividing up the short-circuit current flowing after the opening of the disconnectors 11 between two short-circuit paths 18 simplifies the design of the fuses 20. It becomes therewith also possible more easily to omit the short-circuit path 16 in accordance with FIG. 1 that has been obviated here, with which, before the closing of the short-circuit paths 18, the voltage between the bus lines 8 and 9 after the prior closing of the short-circuit path 17 is reduced even further and which, before the opening of the disconnectors 11, takes a larger proportion of the short-circuit current than the short-circuit path 17. Furthermore, the disconnectors 11 in accordance with FIG. 2 effect only single-pole disconnection of the DC/AC converters 10 from the bus lines 8 and 9, specifically from the bus line 9.

Figure 3:
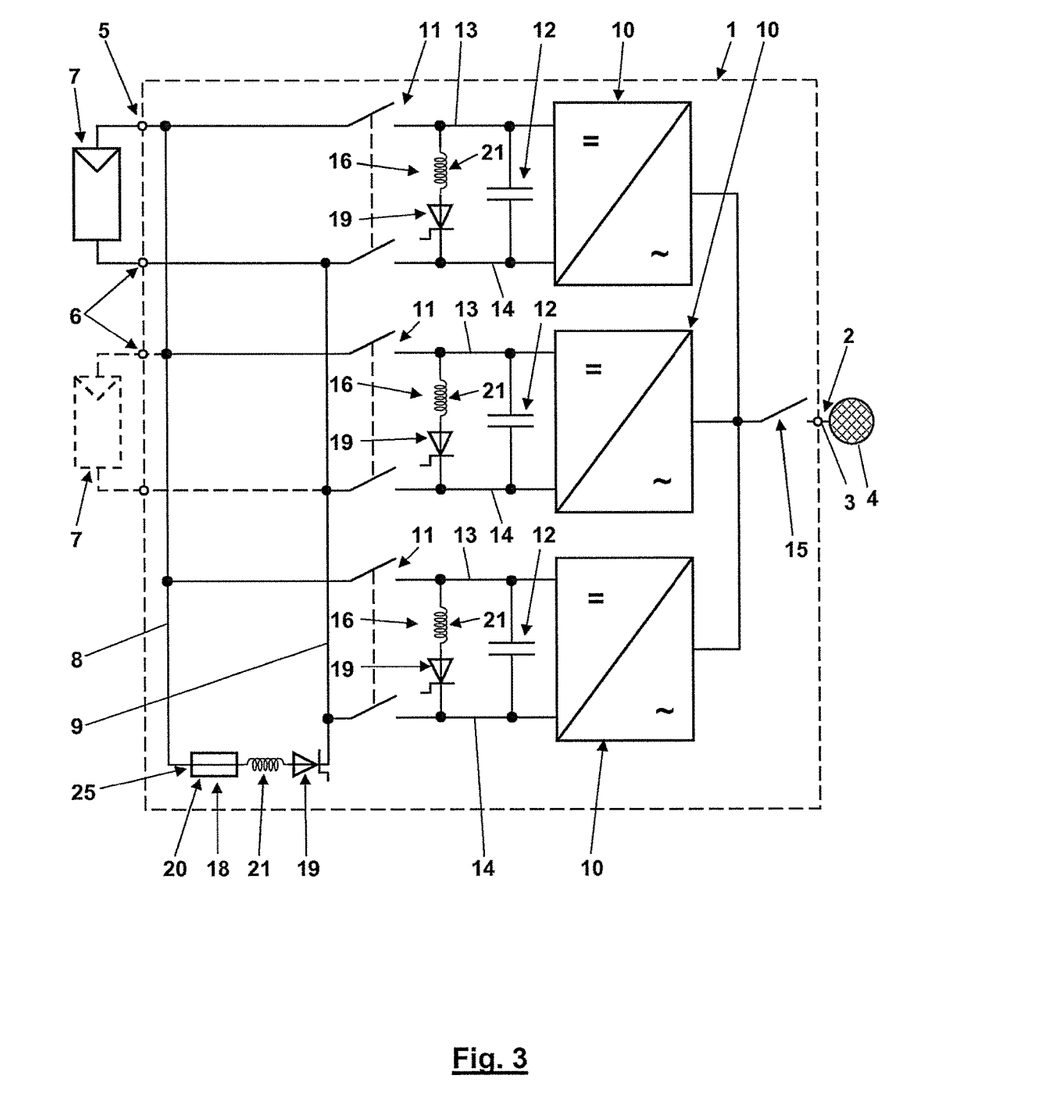
FIG. 3 shows a further embodiment of a circuit arrangement according to the disclosure comprising four short-circuit paths, three of which have an identical structure and are arranged in each case between the connection lines of one of three DC/AC converters of the photovoltaic inverter and downstream of a disconnector of the DC/AC converter.

In the case of the embodiment of the circuit arrangement of the photovoltaic inverter 1 in accordance with FIG. 3, the short-circuit path 17 having the discharge resistor 22 is omitted as against the embodiment in accordance with FIG. 1. Instead, downstream of all the disconnectors 11 and upstream of the associated DC/AC converters 10 short-circuit paths 16 are connected between the connection lines 13 and 14, in each of which an inductor 21 is connected in series with the short-circuit switch 19. The short-circuit current and the energy stored in the intermediate circuit capacitors 12 is distributed among these short-circuit paths 16 if at first the short-circuit switches 19 in the short-circuit paths 16 are closed. If then after that the short-circuit switch 19 in the short-circuit path 18 is closed, the series-connected fuse 20 is not immediately loaded with the full short-circuit current, but rather only after the opening of the disconnectors 11. At this point in time, the tripping of the fuse 20 is desired as soon as the disconnection sections of the disconnectors 11 are deionized sufficiently to ensure that they can no longer become conducting, in order to stop the short-circuit current.

Figure 4:
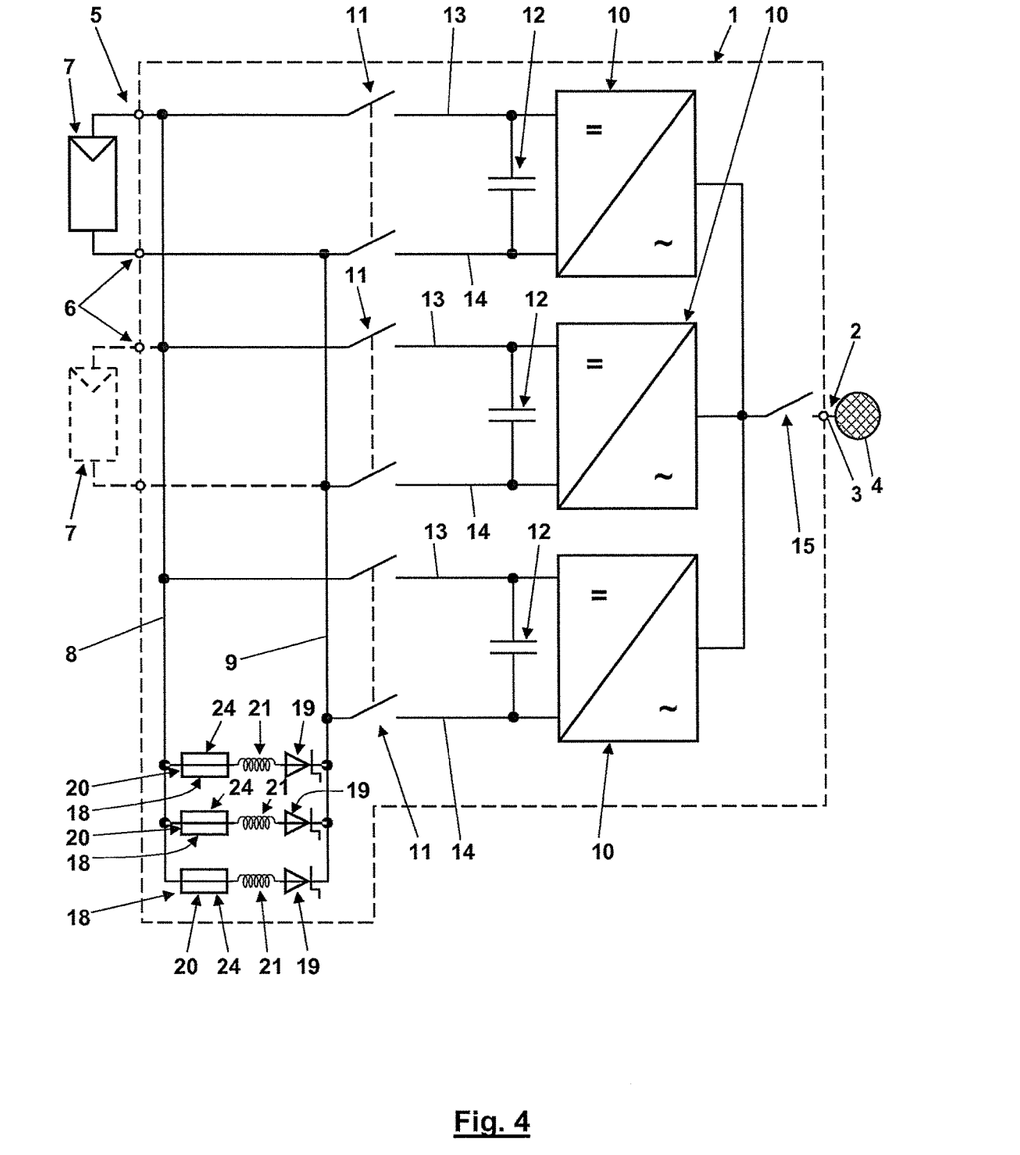
FIG. 4 shows yet another embodiment of a circuit arrangement according to the disclosure comprising three short-circuit paths connected in parallel directly between bus lines and each comprising a triggerable fuse alongside a short-circuit switch.

In the case of the embodiment of the circuit arrangement for the photovoltaic inverter 1 in accordance with FIG. 4, in contrast to the example embodiment according to FIG. 1, neither a short-circuit path 16 nor a short-circuit path 17 is provided downstream of one of the disconnectors 11 and upstream of the associated DC/AC converter 10. Here exclusively a plurality of short-circuit paths 18, specifically three short-circuit paths 18 in the present example, are connected directly between the bus lines 8 and 9. In each of the short-circuit paths 18, a triggerable fuse 24 as fuse 20 is connected in series with the inductor 21 and the short-circuit switch 19. Upon the occurrence of a serious fault with a short circuit of the bus lines 8 and 9 by one of the DC/AC converters 10 and via the associated disconnector 11, the short-circuit switch 19 of one of the short-circuit paths 18 is closed after the opening of the AC contactor 15 and the turning-off of all the DC/AC converters 10. As soon as the voltage between the bus lines 8 and 9 has consequently dropped because the bus lines 8 and 9 are short-circuited by way of the short-circuit path 18 with low resistance, the disconnectors 11 are opened. As soon as enough time has elapsed after the opening of the disconnectors 11 to ensure that the sections between their switching contacts can no longer become conducting, the fuse 20 of the short-circuit path 18 now carrying the entire short-circuit current is triggered to stop the short-circuit current. Thereafter this short-circuit path has been used up until its fuse 20 is replaced. However, the parallel short-circuit paths 18 are still available for renewed safe turning-off of a short-circuit current.

The invention claimed is:

1. A circuit arrangement for a photovoltaic inverter, comprising:
   two bus lines;
   input terminals for connecting at least one photovoltaic generator to the bus lines, respectively;
   at least one DC/AC converter connected to the bus lines via connection lines;
   a disconnector in at least one connection line of the respective connection lines between each DC/AC converter and the bus lines, respectively;
   at least one short-circuit path for short-circuiting a voltage between the bus lines, wherein a short-circuit switch is arranged in the short-circuit path, wherein the at least one short-circuit path extends between the bus lines upstream of all disconnectors between the input terminals and the disconnectors, and wherein the short-circuit switch in the at least one short-circuit path between the bus lines is connected in series with a fuse; and
   at least one further short-circuit path for short-circuiting the voltage between the bus lines or between the connection lines, wherein the at least one further short-circuit path extends between the bus lines or extends between the connection lines, wherein when a respective disconnector is closed the at least one short-circuit path and the at least one further short-circuit path associated with the respective disconnector are in parallel, wherein a further short-circuit switch is arranged in the at least one further short-circuit path.

2. The circuit arrangement as claimed in claim 1, wherein the short-circuit switches in one or more of the short-circuit paths are thyristors.

3. The circuit arrangement as claimed in claim 1, wherein the short-circuit switch in the at least one short-circuit path between the bus lines is furthermore connected in series with a current-limiting component.

4. The circuit arrangement as claimed in claim 1, wherein the at least one further short-circuit path runs between the connection lines of the at least one DC/AC converter, and is connected to the connection lines downstream of the disconnector between the disconnector and the at least one DC/AC converter.

5. The circuit arrangement as claimed in claim 4, wherein at least two DC/AC converters are connected to the bus lines, and downstream of at least two of the disconnectors of the at least two DC/AC converters in each case one of the further short-circuit paths runs between the connection lines of the associated DC/AC converter.

6. The circuit arrangement as claimed in claim 4, wherein downstream of each disconnector one of the further short-circuit paths runs between the connection lines of the associated DC/AC converter.

7. The circuit arrangement as claimed in claim 4, wherein in each further short-circuit path a current-limiting component is connected in series with the respective further short-circuit switch.

8. The circuit arrangement as claimed in claim 7, wherein the current-limiting component in at least one of the further short-circuit paths is a discharge resistor for input-side intermediate circuit capacitors of the DC/AC converters.

9. The circuit arrangement as claimed in claim 7, wherein the current-limiting component in at least one of the further short-circuit paths is an inductor.

10. The circuit arrangement as claimed in claim 1, wherein the at least one further short-circuit path or one of the further short-circuit paths runs in parallel with the at least one short-circuit path between the bus lines upstream of all the disconnectors, wherein the further short-circuit switch in the at least one further short-circuit path is also connected in series with a fuse.

11. The circuit arrangement as claimed in claim 10, wherein the short-circuit switch in the at least one short-circuit path between the bus lines is furthermore connected in series with a current-limiting component, and wherein the further short-circuit switch in the at least one further short-circuit path is also connected in series with a current-limiting component.

12. The circuit arrangement as claimed in claim 1, wherein each disconnector causes all-pole disconnection of the associated DC/AC converter from the bus lines.

13. The circuit arrangement as claimed in claim 1, wherein all DC/AC converters are configured to be connected on their output side via a common AC contactor or a dedicated AC contactor to an output terminal configured to couple to an AC grid.

14. A use of a circuit arrangement for a photovoltaic inverter, comprising:
   two bus lines;
   input terminals for connecting at least one photovoltaic generator to the bus lines, respectively;
   at least one DC/AC converter connected to the bus lines via connection lines;
   a disconnector in at least one connection line of the respective connection lines between each DC/AC converter and the bus lines, respectively;
   at least one short-circuit path for short-circuiting a voltage between the bus lines, wherein a short-circuit switch is arranged in the short-circuit path, wherein the at least one short-circuit path extends between the bus lines upstream of all disconnectors between the input terminals and the disconnectors, and wherein the short-circuit switch in the at least one short-circuit path between the bus lines is connected in series with a fuse; and
   at least one further short-circuit path for short-circuiting the voltage between the bus lines or between the connection lines, wherein the at least one further short-circuit path extends between the bus lines or extends between the connection lines, wherein when a respective disconnector is closed the at least one short-circuit path and the at least one further short-circuit path associated with the respective disconnector are in parallel, wherein a further short-circuit switch is arranged in the at least one further short-circuit path,
   wherein the use comprises opening all the disconnectors in the case of conducting short-circuit switches.

15. The use as claimed in claim 14, wherein in the circuit arrangement the at least one further short-circuit path between the connection lines of the at least one DC/AC converter, and is connected to the connection lines downstream of the disconnector between the disconnector and the at least one DC/AC converter,
   wherein in the use all short-circuit switches in all short-circuit paths between the bus lines upstream of all disconnectors are closed only after all short-circuit switches in all short-circuit paths downstream of all disconnectors and between the connection lines of the associated DC/AC converter.

16. The use as claimed in claim 15, wherein in the circuit arrangement the at least one further short-circuit path or one of the further short-circuit paths runs in parallel with the at least one short-circuit path between the bus lines upstream of all the disconnectors, wherein the further short-circuit switch in the at least one further short-circuit path is also connected in series with a fuse.

17. The use as claimed in claim 14, wherein in the circuit arrangement the at least one further short-circuit path between the connection lines of the at least one DC/AC converter, and is connected to the connection lines downstream of the disconnector between the disconnector and the at least one DC/AC converter, wherein in each further short-circuit path a current-limiting component is connected in series with the respective further short-circuit switch, and wherein the current-limiting component in at least one of the further short-circuit paths is a discharge resistor for input-side intermediate circuit capacitors of the DC/AC converters,
   wherein in the use each further short-circuit switch connected in series with a discharge resistor in one of the further short-circuit paths is closed before all other short-circuit switches are closed.

18. The use as claimed in claim 14, wherein in the circuit arrangement all DC/AC converters are configured to be connected on their output side via a common AC contactor or a dedicated AC contactor to an output terminal configured to couple to an AC grid, wherein in the use the AC contactor(s) is/are turned off before the short-circuit switches are closed.

19. A use of a circuit arrangement for a photovoltaic inverter, comprising:
   two bus lines;
   input terminals for connecting at least one photovoltaic generator to the bus lines, respectively;
   at least one DC/AC converter connected to the bus lines via connection lines;
   a disconnector in at least one connection line of the respective connection lines between each DC/AC converter and the bus lines, respectively;
   at least one short-circuit path for short-circuiting a voltage between the bus lines, wherein a short-circuit switch is arranged in the short-circuit path, wherein the at least one short-circuit path extends between the bus lines upstream of all disconnectors between the input terminals and the disconnectors, and wherein the short-circuit switch in the at least one short-circuit path between the bus lines is connected in series with a fuse; and
   at least one further short-circuit path for short-circuiting the voltage between the bus lines or between the connection lines, wherein the at least one further short-circuit path extends between the bus lines or extends between the connection lines, wherein when a respective disconnector is closed the at least one short-circuit path and the at least one further short-circuit path associated with the respective disconnector are in parallel, wherein a further short-circuit switch is arranged in the at least one further short-circuit path, wherein the use comprises opening the disconnector of the at least one DC/AC converter, if a DC current flows from the bus lines to the at least one DC/AC converter that exceeds a limiting break capacity of the disconnector, in the case of conducting short-circuit switches.

20. The use as claimed in claim 19, wherein in the circuit arrangement the at least one further short-circuit path between the connection lines of the at least one DC/AC converter, and is connected to the connection lines downstream of the disconnector between the disconnector and the at least one DC/AC converter, wherein in the use all short-circuit switches in all short-circuit paths between the bus lines upstream of all disconnectors are closed only after all short-circuit switches in all short-circuit paths downstream of all disconnectors and between the connection lines of the associated DC/AC converter.

21. The use as claimed in claim 20, wherein in the circuit arrangement the at least one further short-circuit path or one of the further short-circuit paths runs in parallel with the at least one short-circuit path between the bus lines upstream of all the disconnectors, wherein the further short-circuit switch in the at least one further short-circuit path is also connected in series with a fuse.

22. The use as claimed in claim 19, wherein in the circuit arrangement the at least one further short-circuit path between the connection lines of the at least one DC/AC converter, and is connected to the connection lines downstream of the disconnector between the disconnector and the at least one DC/AC converter, wherein in each further short-circuit path a current-limiting component is connected in series with the respective further short-circuit switch, and wherein the current-limiting component in at least one of the further short-circuit paths is a discharge resistor for input-side intermediate circuit capacitors of the DC/AC converters, wherein in the use each further short-circuit switch connected in series with a discharge resistor in one of the further short-circuit paths is closed before all other short-circuit switches are closed.

23. The use as claimed in claim 19, wherein in the circuit arrangement all DC/AC converters are configured to be connected on their output side via a common AC contactor or a dedicated AC contactor to an output terminal configured to couple to an AC grid, wherein in the use the AC contactor(s) is/are turned off before the short-circuit switches are closed.

* * * * *